US008788550B1

(12) United States Patent
Padalia et al.

(10) Patent No.: US 8,788,550 B1
(45) Date of Patent: *Jul. 22, 2014

(54) STRUCTURES FOR LUT-BASED ARITHMETIC IN PLDS

(75) Inventors: Ketan Padalia, Thornhill (CA); David Cashman, Toronto (CA); David Lewis, Toronto (CA); Andy L. Lee, San Jose (CA); Jay Schleicher, Santa Clara (CA); Jinyong Yuan, Cupertino (CA); Henry Kim, San Jose, CA (US)

(73) Assignee: Altera Corporation, San Jose, CA (US)

( * ) Notice: Subject to any disclaimer, the term of this patent is extended or adjusted under 35 U.S.C. 154(b) by 782 days.

This patent is subject to a terminal disclaimer.

(21) Appl. No.: 12/484,010

(22) Filed: Jun. 12, 2009

Related U.S. Application Data

(63) Continuation of application No. 10/723,104, filed on Nov. 26, 2003, now Pat. No. 7,558,812.

(51) Int. Cl.
*G06F 7/38* (2006.01)
(52) U.S. Cl.
USPC .............................. 708/235; 236/38
(58) Field of Classification Search
USPC ................. 708/230, 232, 235; 326/41, 48
See application file for complete search history.

(56) References Cited

U.S. PATENT DOCUMENTS

| | | | |
|---|---|---|---|
| 5,682,107 | A | 10/1997 | Tavana et al. |
| 5,724,276 | A | 3/1998 | Rose et al. |
| 5,805,477 | A | 9/1998 | Perner |
| 6,154,053 | A | 11/2000 | New |
| 6,188,240 | B1 | 2/2001 | Nakaya |
| 6,288,570 | B1 | 9/2001 | New |
| 6,798,240 | B1 | 9/2004 | Pedersen |

OTHER PUBLICATIONS

U.S. Office Action mailed May 4, 2007 in U.S. Appl. No. 10/723,104.
U.S. Final Office Action mailed Oct. 19, 2007 in U.S. Appl. No. 10/723,104.
U.S. Advisory Action mailed Jan. 28, 2008 in U.S. Appl. No. 10/723,104.
U.S. Office Action mailed May 9, 2008 in U.S. Appl. No. 10/723,104.
U.S. Final Office Action mailed Oct. 29, 2008 in U.S. Appl. No. 10/723,104.
U.S. Advisory Action mailed Feb. 13, 2009 in U.S. Appl. No. 10/723,104.
U.S. Notice of Allowance and Fee(s) due mailed Mar. 16, 2009 in U.S. Appl. No. 10/723,104.

*Primary Examiner* — Chuong D Ngo
(74) *Attorney, Agent, or Firm* — Kwan & Olynick LLP

(57) ABSTRACT

A programmable logic device (PLD) includes a plurality of logic array blocks (LAB's) connected by a PLD routing architecture. At least one LAB includes a logic element (LE) configurable to arithmetically combine a plurality of binary input signals in a plurality of stages. The LE comprises look-up table (LUT) logic having K inputs (a "K-LUT"). The K-LUT is configured to input the binary input signals at respective inputs of the K-LUT logic cell and to provide, at a plurality of outputs of the K-LUT logic cell, respective binary result signals indicative of at least two of the plurality of stages of the arithmetic combination of binary input signals. An input line network includes a network of input lines, the input lines configurable to receive input signals from the PLD routing architecture that represent the binary input signals and to provide the input signals to the K-LUT. An output line network includes a network of output lines, the output lines configured to receive, from the K-LUT, output signals that represent the binary result signals and to provide the output signals to the PLD routing architecture. The described LUT's can perform arithmetic efficiently, as well as non-arithmetic functions.

20 Claims, 12 Drawing Sheets

STRUCTURES FOR LUT-BASED ARITHMETIC IN PLDS

CROSS-REFERENCE TO RELATED INVENTIONS

This application is a continuation of U.S. patent application Ser. No. 10/723,104 entitled "Structures For LUT-Based Arithmetic In PLDS" and filed on Nov. 26, 2003, which is hereby incorporated by reference in its entirety.

BACKGROUND OF THE INVENTION

The present invention is in the field of programmable logic devices (PLD's) and, more particularly, is related to the use of look-up tables (LUTs) in logic elements (LEs) of PLD's where not only are multiple stages of arithmetic performed in each LUT but, also, the LUTs are configurable to accomplish multiple non-arithmetic functions with reduced input sharing requirements.

A common use for LE logic in a PLD is to perform arithmetic operations. LEs of conventional PLDs provide arithmetic functionality with 4-input LUTs. (We refer to a LUT with "x" inputs as an "x-LUT.") FIG. 1 is a block diagram of a conventional 4-LUT 100.

The 4-LUT 100 can be thought of, functionally, as two 3-LUTs 102 and 104. The 4-LUT 100 performs arithmetic, with the ability to add two bits in each 3-LUT 102 and 104. A multiplexer 106 selects between the outputs of the 3-LUTs 102 and 104, using the fourth data input D to the 4-LUT 100 as a select line to control the output of the multiplexer 106. Conventional implementations of LUT arithmetic use one 3-LUT of a 4-LUT to generate the sum from two summand signals and the carry_in of the previous stage. The other 3-LUT generates the carry_out of the stage from the same three input signals (i.e. the two summand signals and the carry_in of the previous stage). A benefit of such a scheme is that an arithmetic sum output is generated by the same output circuitry that may be used to generate separate arithmetic functions. This allows arithmetic to be performed without requiring any additional multiplexers for selection between different outputs. FIG. 2 is a block diagram of a LUT 200, illustrating the LUT 100 configured according to the conventional approach.

BRIEF SUMMARY OF THE INVENTION

A programmable logic device (PLD) includes a plurality of logic array blocks (LAB's) connected by a PLD routing architecture. At least one LAB includes a logic element (LE) configurable to arithmetically combine a plurality of binary input signals in a plurality of stages.

The LE comprises look-up table (LUT) logic having K inputs (a "K-LUT"). The K-LUT is configured to input the binary input signals at respective inputs of the K-LUT logic cell and to provide, at a plurality of outputs of the K-LUT logic cell, respective binary result signals indicative of at least two of the plurality of stages of the arithmetic combination of binary input signals.

An input line network includes a network of input lines, the input lines configurable to receive input signals from the PLD routing architecture that represent the binary input signals and to provide the input signals to the K-LUT. An output line network includes a network of output lines, the output lines configured to receive, from the K-LUT, output signals that represent the binary result signals and to provide the output signals to the PLD routing architecture.

The described LUT's can perform arithmetic efficiently, as well as non-arithmetic functions.

DETAILED DESCRIPTION OF THE INVENTION

In accordance with a broad aspect of the invention, LEs are provided with k-LUT's (typically, but not limited to, where k≥4), wherein multiple stages of arithmetic may be performed in each k-LUT. The k-LUT may be, but is not required to be, fracturable. A fracturable LUT is a LUT that includes "extra" inputs, such that input sharing requirements are reduced (while not necessarily precluding input sharing, however).

Figure 1:
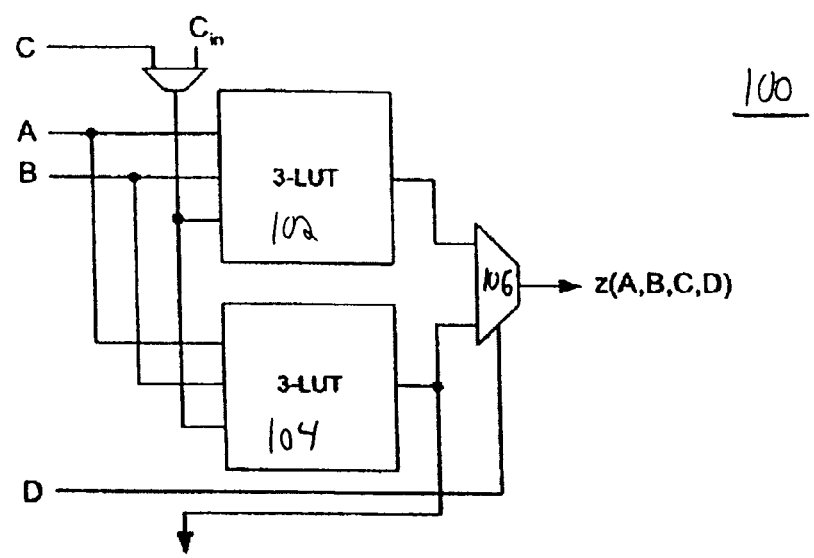
FIG. 1 is a block diagram of a conventional 4-LUT 100.
Figure 2:
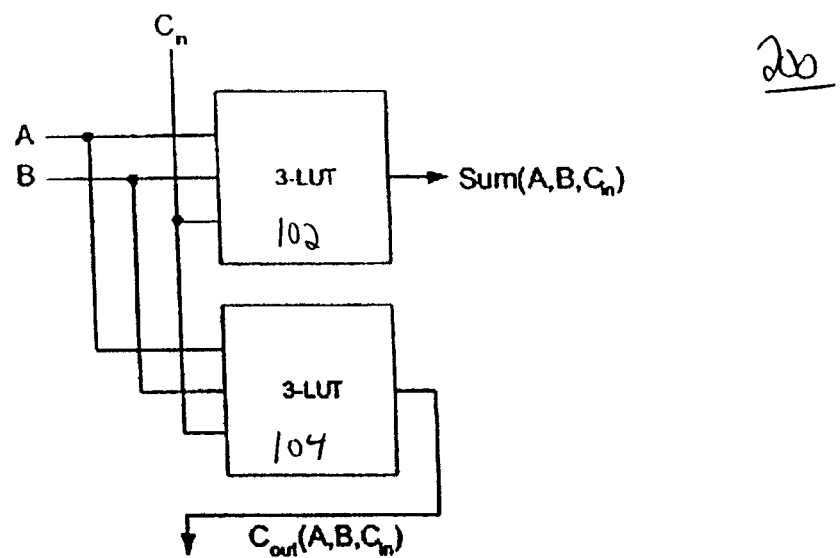
FIG. 2 is a block diagram of a LUT 200, illustrating the LUT 100 configured according to a conventional approach.
Figure 3:
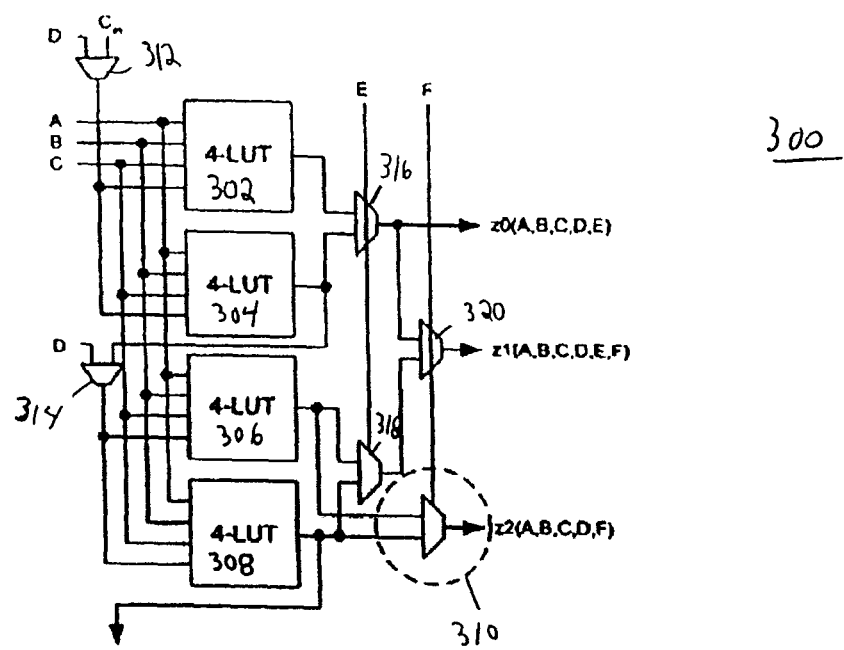
FIG. 3 illustrates a fracturable 6-LUT 300.

The principle of fracturable LUTs is illustrated in FIG. 3, where a fracturable 6-LUT 300 is shown. What makes the 6-LUT 300 fracturable is a 2:1 output multiplexer 310 (circled in the figure). When used to perform an arithmetic function, the output signal z1 is a function of all 6 inputs (A through F). When used to accomplish separate logic functions, the output multiplexer 310 is configured such that the z0 output, which is provided from the portion of the LUT 300 including 4-LUTs 302 and 304 provides a function of A, B, C, D, and E while the z2 output, provided from the 2:1 multiplexer 310, provides a function of A, B, C, D, and F. In this way, the LUT 300 can implement two different 5-input logic functions as long as those two logic functions share four inputs (i.e. A, B, C, and D). The input multiplexers 312, 314 select between carry signals and the D input to allow for arithmetic operation (by allowing the second and fourth 4-LUTs 304 and 308 to steal the D signal as a carry_out signal).

When using fracturable LUTs, there are multiple outputs from each logic element, allowing the fracturable LUT to perform more than one stage of LUT-based arithmetic without requiring any additional output logic. For example, a logic element with a fracturable K-LUT can use one (K-1)-LUT to accomplish one stage of arithmetic and the other (K-1)-LUT to accomplish a second stage of the arithmetic. Each of these (K-1)-LUTs can be thought of as having two (K-2)-LUTs. One of these (K-2)-LUTs can be used to provide the sum for two functions of no more than K-3 distinct input signals in total (the sum being a function of those K-3 inputs and the carry_in from the previous stage). The other (K-2)-LUT can be used to provide the carry_out of the stage (as a function of the same K-3 inputs and the carry_in of the previous stage).

Figure 4:
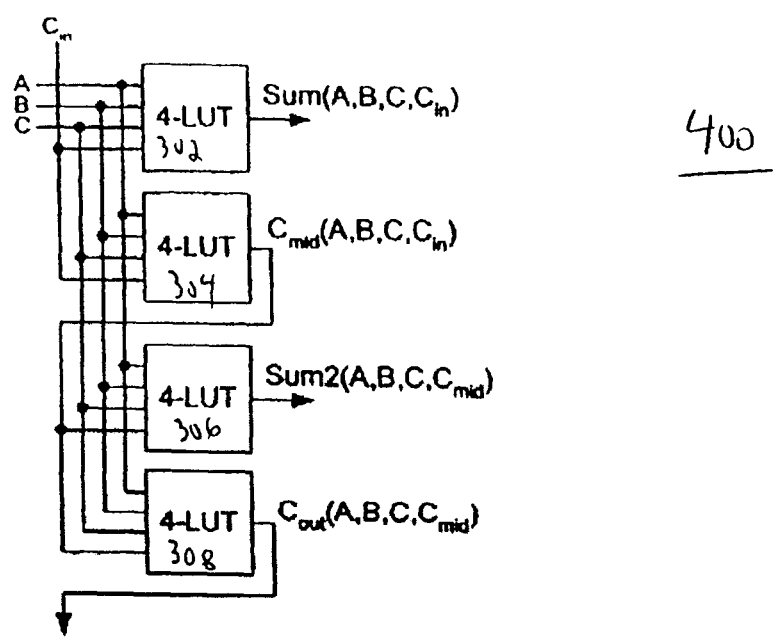
FIG. 4 is a block diagram of a LUT 400, illustrating the LUT 300 configured according to a particular approach.

FIG. 4 is a block diagram of a LUT 400, illustrating the LUT 300 configured according to the approach just discussed with reference to FIG. 3. As illustrated in FIG. 4, the output multiplexer 316 (FIG. 3) is configured to provide the output of 4-LUT 302, and the output multiplexer 318 (FIG. 3) is configured to provide the output of 4-LUT 306. In some embodiments, the LUTs are fractured even further to have N outputs, to perform N stages of arithmetic in each such fracturable LUT.

As discussed above, the output multiplexer 310 (FIG. 3) is provided to reduce the input sharing requirements when the LUT 300 is used to accomplish two functions. In that sense, the output multiplexer 310 is not material when the LUT 300 is used to accomplish arithmetic, as configured in FIG. 4. Put another way, the output multiplexer 310 contributes to the flexibility of the LUT 300 for use to implement functions (lessening the input sharing requirements for the functions), such that the LUT 300 is also configurable as shown in FIG. 4 to accomplish arithmetic.

The scheme just described with reference to FIG. 3 and FIG. 4 allows each stage of arithmetic to implement the sum for two functions of no more than 3 distinct inputs in total. All 3 distinct inputs are shared between the two stages that a single LUT can implement—A, B, and C in FIG. 4. That is, the LUT uses shared inputs to implement multiple logic functions, and only those pairs of (K-1)-input functions that meet this sharing requirement can be put in the same LUT. This property of fracturable LUTs makes it desirable to minimize the amount of sharing that is required between two stages of arithmetic, which allows for a wider range of arithmetic functions.

Figure 5:
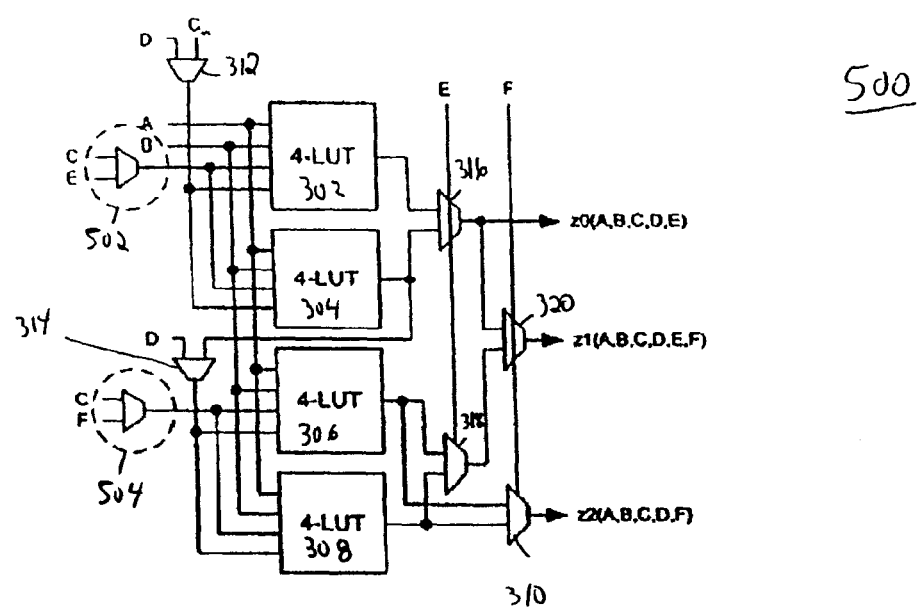
FIG. 5 is a block diagram of a LUT 500, illustrating how the LUT 300 (FIG. 3) can be enhanced, including the input multiplexers 502 and 504.
Figure 6:
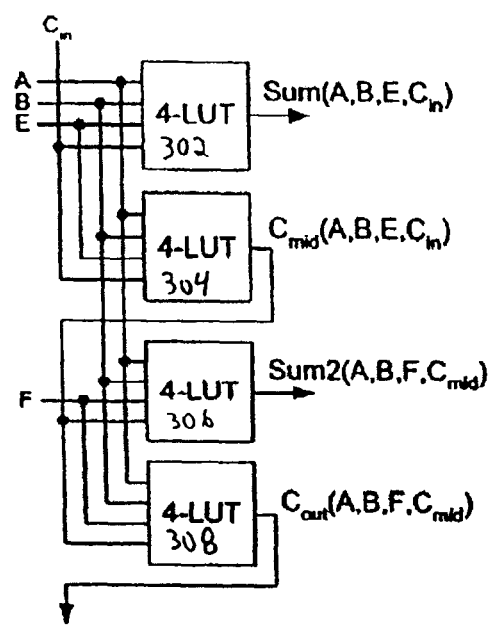
FIG. 6 is a block diagram of a LUT 600, illustrating how the LUT 500 may be configured according to a particular approach.

As discussed below, this minimization of input sharing can be accomplished with input multiplexers that allow portions of the LUT to use otherwise unused inputs, to reduce the sharing requirement. FIG. 5 is a block diagram of a LUT 500, illustrating how the LUT 300 (FIG. 3) can be enhanced, including the input multiplexers 502 and 504. FIG. 6 is a block diagram of a LUT 600, illustrating how the LUT 500 may be configured according to the approach just discussed with reference to FIG. 5. In particular, FIG. 6 shows the LUT 500 configured to implement sums of no more than three distinct inputs in total, where only two of the three signals (A and B in FIG. 6) are shared between stages of arithmetic in the same LUT. This is in contrast to the three input signals that are shared in the FIG. 4 LUT 400.

Figure 7:
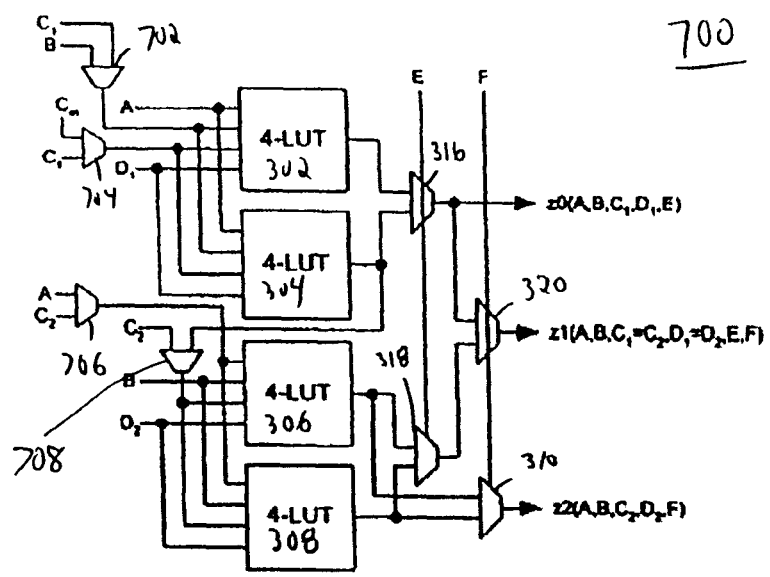
FIG. 7 shows such a particular example 700 of the LUT 300 with additional input multiplexers 702, 704, 706 and 708 provided.
Figure 8:
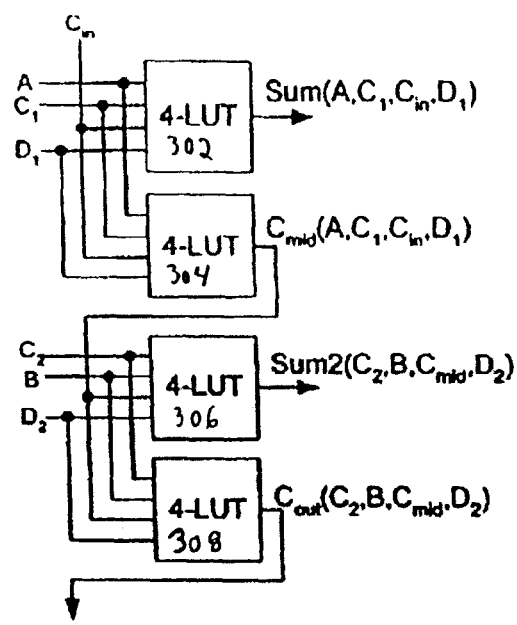
FIG. 8 illustrates a LUT 800 that is similar to the LUT 700, configured to accomplish arithmetic in a manner similar to that of the LUT 600 (FIG. 6) but without any input sharing requirement.

Additional input multiplexers may be provided to allow for more than K inputs to a fracturable K-LUT. For example, FIG. 7 shows such a particular example 700 of the LUT 300 with additional input multiplexers 702, 704, 706 and 708 provided to achieve a fracturable 6-LUT with 8 inputs. FIG. 8 illustrates a LUT 800 that is similar to the LUT 700, configured to accomplish arithmetic in a manner similar to that of the LUT 600 (FIG. 6) but without any input sharing requirement. That is, in FIG. 8, the LUTs 302 and 304 perform one stage of arithmetic—the sum of two functions of no more than three inputs (A, $C_1$, and $D_1$). The LUTs 306 and 308 perform another stage of arithmetic—the sum of two functions of a completely different set of three inputs ($C_2$, B, and $D_2$).

Figure 9:
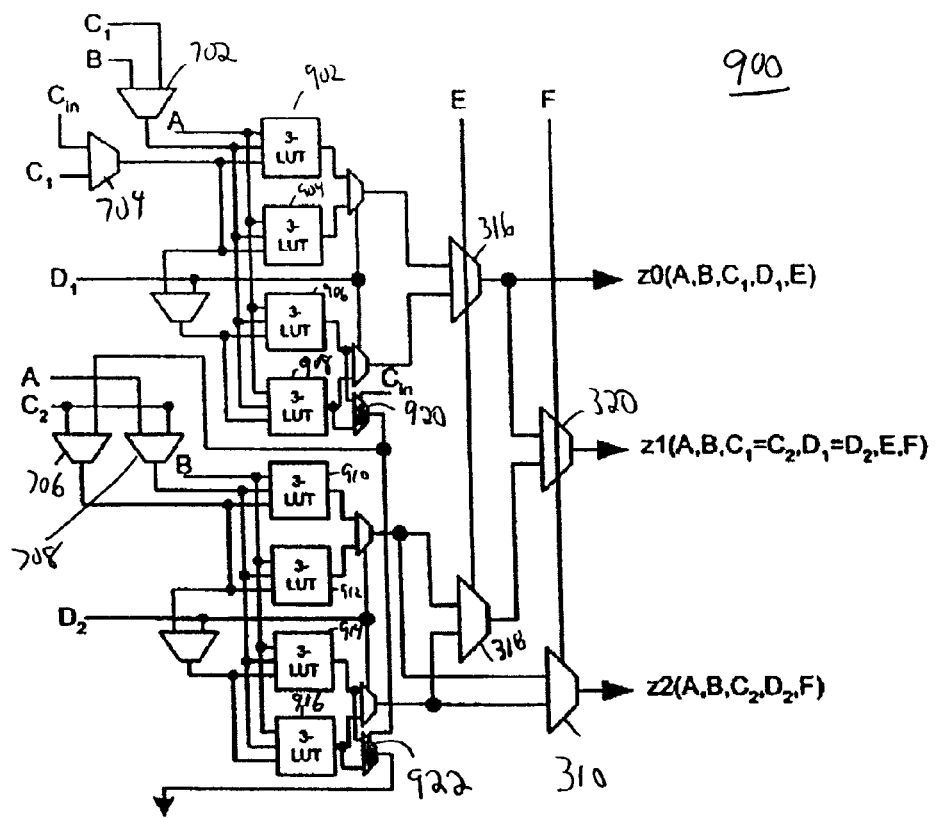
FIG. 9 illustrates a LUT 900 which shows the 4-LUTs 302, 304, 306 and 308 as the component 3-LUTs.

We now discuss embodiments in which the arithmetic performance of a fracturable LUT is increased by providing a special path for the $C_{in}$ signal. That is, with the FIG. 7 LUT 700, the fractured inputs (C1, C2, D1, and D2) are in the middle of the LUT input stages. (By convention, the inputs are labeled such that A is the earliest and, hence, slowest stage. Meanwhile, the input F is the latest and, hence, fastest stage. Because the $C_{in}$ input uses the same input multiplexer as the $C_1$ and $C_2$ inputs, the path from $C_{in}$ to $C_{out}$ goes through three levels of multiplexing (the multiplexer to select $C_{in}$, the C-input stage of the LUT, and the D-stage of the LUT). FIG. 9 illustrates a LUT 900 which shows the 4-LUTs 302, 304, 306 and 308 as the component 3-LUTs (902 and 904; 906 and 908; 910 and 912; and 914 and 916).

Figure 10:
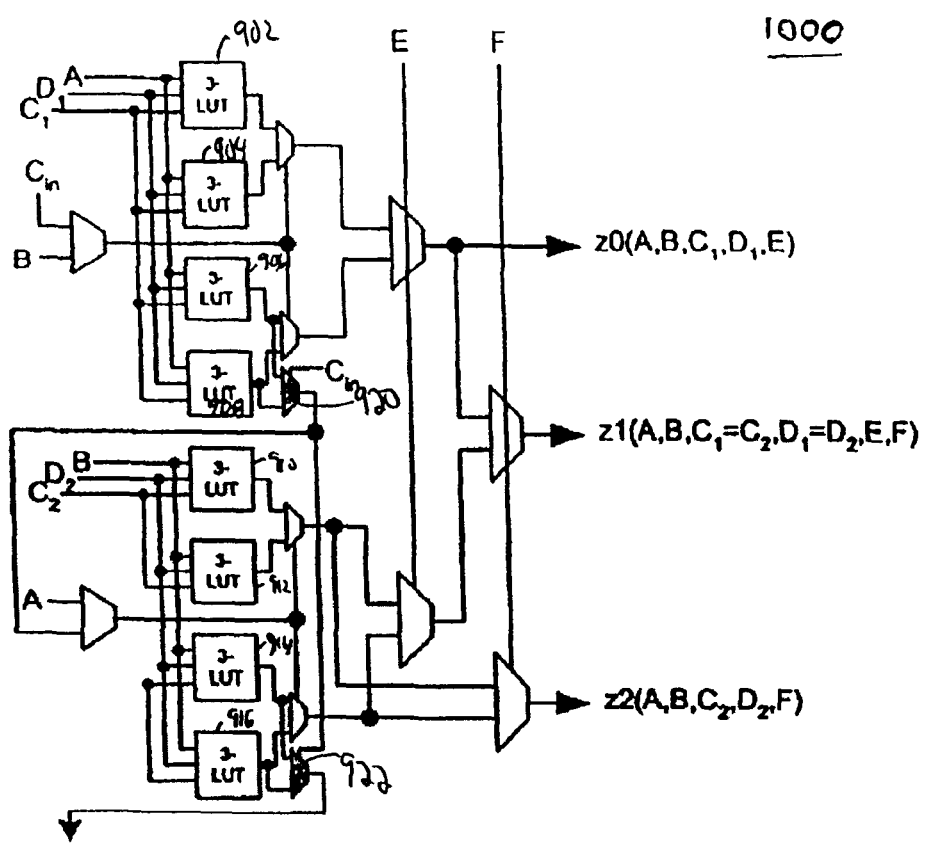
FIG. 10 illustrates a LUT 1000 in which this issue is addressed by exchanging where certain signals are used in the top and bottom half of the LUT, as well as by moving the fractured inputs ($C_1$, $C_2$, $D_1$, and $D_2$) to earlier LUT stages.

In addition, two multiplexers 920 and 922 are provided to provide a more direct input path for the signal. With the multiplexers 920 and 922, the path from carry_in to carry_out takes one stage of multiplexing. This scheme, however, still uses additional multiplexers before the LUTs, which can slow down the signals being multiplexed as well as waste area in the LUT. FIG. 10 illustrates a LUT 1000 in which this issue is addressed by exchanging where certain signals are used in the top and bottom half of the LUT, as well as by moving the fractured inputs ($C_1$, $C_2$, $D_1$, and $D_2$) to earlier LUT stages.

A disadvantage of using the structure illustrated by FIG. 10 as opposed to the structure illustrated by FIG. 9 is that a full 6-input LUT has both inputs A and B having the delay of the slowest LUT stage. This is because input A feeds the slowest stage in the top half, while input B feeds the slowest stage in the bottom half. Furthermore, the fractured inputs are in slower LUT stages. The fractured inputs being in slower LUT stages can be an advantage as well, a tradeoff that can be considered when deciding on which structure to use.

Figure 11:
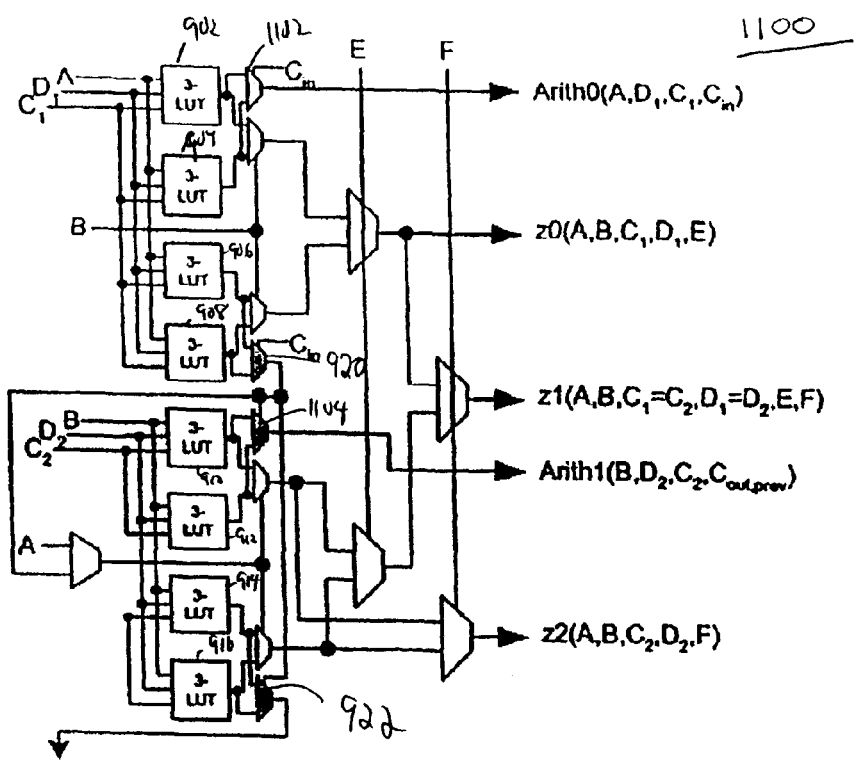
FIG. 11 illustrates a LUT 1100 that includes two additional outputs Arith0 and Arith1 (which are used when doing LUT-based arithmetic), and two multiplexers 1102 and 1104, that feed those respective outputs with the sum.

Although the carry_in to carry_out path has been shortened in FIG. 9 and FIG. 10, the carry_in to sum path is still relatively long. That is, after carry_in is applied (to the C input stage in FIG. 9 and to the D input stage in FIG. 10), it travels through at least 3 multiplexer stages before reaching the LUT output as the sum signal. By creating an extra output for the LUT, a technique similar to that used to shorten the carry_in to carry_out path can be used to speed up the carry_in to sum path. FIG. 11 illustrates a LUT 1100 that includes two additional outputs Arith0 and Arith1 (which are used when doing LUT-based arithmetic), and two multiplexers 1102 and 1104, that feed those respective outputs with the sum.

Adding extra outputs to the LUT is particularly effective for a fracturable LUT because there are already multiple outputs from the LUT, and output multiplexers are used to select from the multiple outputs. This technique is generally applicable, however, and can be used for regular non-fracturable LUTs, particularly if the additional output multiplexing cost is acceptable to achieve a shorter carry path.

A further disadvantage of the FIG. 10 LUT 1000 is that the inputs A and B both have the largest LUT delay when a 6-input LUT is used because the output of the 6-input LUT is a function of both A and B. That is, because A and B are in opposite orders in the LUT inputs, both A and B are used in the slowest stage of either the top-half LUT or bottom-half LUT. Thus, the worst-case delay is applied to both when calculating the delay of the circuit. The reason this is done is to allow the top half and bottom half to have different arithmetic functions even though the A and B inputs are not fractured.

Figure 12:
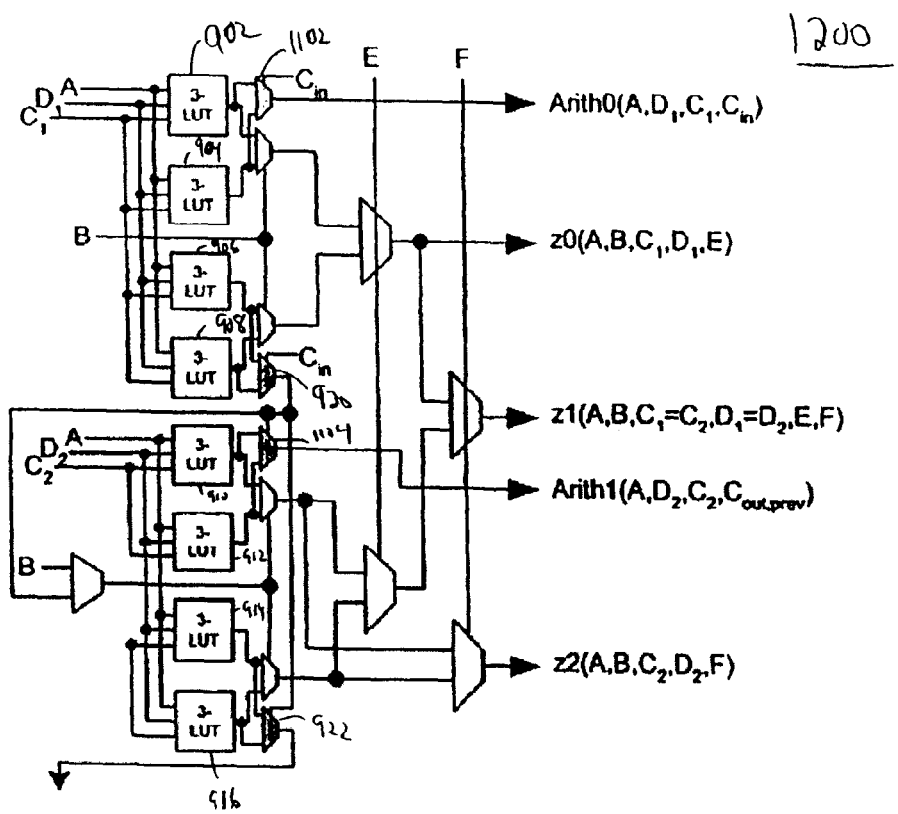
FIG. 12 illustrates a LUT 1200 configured in a manner that "undoes" an input swap to remove a speed penalty resulting therefrom.

FIG. 12 illustrates a LUT 1200 configured in a manner that "undoes" this swap to remove the speed penalty. However, an associated cost is that the two arithmetic functions now share one input between them. This can be an acceptable cost for a LUT that is large enough that requiring one shared input does not significantly hurt the flexibility of functions that can be implemented.

Although particular embodiments have been described in detail, various modifications to the embodiments described herein may be made without departing from the spirit and scope of the present invention, thus, the invention is limited only by the appended claims. For example, the disclosed embodiments may be employed in conjunction with LUTs that use LUT mask sharing as disclosed in U.S. Pat. No. 6,798,240, filed Jan. 24, 2003 and assigned to the assignee of the present patent application.

What is claimed as new and desired to be protected by Letters Patent of the United States is:

1. A programmable logic device (PLD) including a plurality of logic array blocks (LAB's) connected by a PLD routing architecture, wherein at least one LAB includes a logic element (LE) configurable to arithmetically combine a plurality of binary input signals in a plurality of stages, the LE comprising:
a K-input look-up table (LUT) ("K-LUT"), the K-LUT arranged to receive the plurality of binary input signals at respective inputs of the K-LUT and to provide, at a plurality of outputs of the K-LUT, respective binary result signals indicative of at least two stages of the plurality of stages of the arithmetic combination of the plurality of binary input signals;
an input line network including a network of input lines, the network of input lines arranged to receive a plurality of representative input signals from the PLD routing architecture that represent the plurality of binary input signals and to provide the plurality of binary input signals to the K-LUT, the input line network being configured to provide at least a first one of the plurality of binary input signals to both a first K-LUT portion and a second K-LUT portion in a first state, and provide a first carry-in signal to the first K-LUT portion and a second carry-in signal, which differs from the first carry-in signal, to the second K-LUT portion in a second state; and
an output line network including a network of output lines, the network of output lines arranged to receive, from the K-LUT, output signals that represent the binary result signals and to provide the network of output signals to the PLD routing architecture.

2. The PLD of claim 1, wherein:
the K-LUT includes a plurality of portions, each portion connected to the routing architecture via the input line network to receive at least some of the representative input signals; and
each portion of the plurality of portions of the K-LUT includes circuitry to generate the binary result signals indicative of a one of the plurality of stages of the arithmetic combination of the plurality of binary input signals.

3. The PLD of claim 2, wherein:
the plurality of binary input signals are provided to each portion of the plurality of portions of the K-LUT.

4. The PLD of claim 2, wherein:
the input line network includes selector circuitry operable such that,
in the first state, wherein each collection of inputs to the K-LUT that includes an input to each portion of the plurality of portions of the K-LUT receives a same particular binary input signal, and
in the second state, at least one collection of inputs to the K-LUT does not receive the particular binary input signal.

5. The PLD of claim 4, wherein:
the selector circuitry of the input line network includes a plurality of input multiplexers, wherein outputs of said plurality of input multiplexers are connected to the collection of inputs to the K-LUT, and
the plurality of input multiplexers is operable such that, in the first state, each input multiplexer of the plurality of input multiplexers provides the particular binary input signal to the output of that multiplexer and, in the second state, each of at least some of the plurality of input multiplexers provides other than the particular binary input signal to the output of such input multiplexer.

6. A programmable logic device (PLD) including a plurality of logic array blocks (LAB's) connected by a PLD routing architecture, wherein at least one LAB includes a logic element (LE) configurable to arithmetically combine a plurality of binary input signals in a plurality of stages, the LE comprising:
a K-input look-up table (LUT) ("K-LUT"), the K-LUT arranged to receive the plurality of binary input signals at respective inputs of the K-LUT and to provide, at a plurality of outputs of the K-LUT, respective binary result signals indicative of the arithmetic combination of the plurality of binary input signals;
an input line network including a network of input lines, the network of input lines arranged to receive a plurality of representative input signals from the PLD routing architecture that represent the plurality of binary input signals and to provide the plurality of binary input signals to the K-LUT, the input line network being arranged to provide at least a first one of the plurality of binary input signals to both a first K-LUT portion and a second K-LUT portion in a first state, and provide a first carry-in signal to the first K-LUT portion and a second carry-in signal, which differs from the first carry-in signal, to the second K-LUT portion in a second state;
an output line network including a network of output lines, the network of output lines arranged to receive, from the K-LUT, a plurality of representative output signals that represent the binary result signals and to provide the plurality of representative output signals to the PLD routing architecture; and
at least one output multiplexer, each of the at least one output multiplexers coupled to select among the respective binary result signals directly at the outputs of the K-LUT under the control of a carry-in signal to the LE, to provide an arithmetic output signal from the LE to an output line of the output line network.

7. The PLD of claim 6, wherein:
the K-LUT includes a plurality of portions, each portion connected to the PLD routing architecture via the input line network to receive at least some of the representative input signals; and
each portion of the plurality of portions of the K-LUT includes circuitry to generate the binary result signals, which are indicative of a plurality of stages of the arithmetic combination of the plurality of binary input signals.

8. The PLD of claim 7, wherein:
the plurality of binary input signals are provided to each portion of the plurality of portions of the K-LUT.

9. The PLD of claim 7, wherein:
the input line network includes selector circuitry operable such that,
in the first state, wherein each collection of inputs to the K-LUT that includes an input to each portion of the plurality of portions of the K-LUT receives a same particular binary input signal, and
in the second state, at least one collection of inputs to the K-LUT does not receive the particular binary input signal.

10. The PLD of claim 7, wherein:
the K-LUT portions include at least a first K-LUT portion and a second K-LUT portion;
the first K-LUT portion is comprised of a first sub-portion and a second sub-portion; and
the second K-LUT portion is comprised of a third sub-portion and a fourth sub-portion,
wherein each of the-at least one output multiplexer is operable to selectively provide an output from one of the third sub-portion and the fourth sub-portion, based on signal indicative of a signal output from the second sub-portion.

11. The PLD of claim 7, wherein:
the input line network includes at least a first input multiplexer between the routing architecture and a first one of the K-LUT portions and at least a second input multiplexer between the routing architecture and a second one of the K-LUT portions.

12. A programmable logic device (PLD) including a plurality of logic array blocks (LAB's) connected by a PLD routing architecture, wherein at least one LAB includes a logic element (LE) configurable to arithmetically combine a plurality of binary input signals in a plurality of stages, the LE comprising:
a K input look-up table ("K-LUT"), the K-LUT arranged to receive the plurality of binary input signals at respective inputs of the K-LUT and to provide, at a plurality of outputs of the K-LUT, respective binary result signals indicative of at least two stages of the plurality of stages of the arithmetic combination of plurality of binary input signals;
an input line network including a network of input lines and an input multiplexer, the network of input lines arranged to receive a plurality of representative input signals from the PLD routing architecture that represent the plurality of binary input signals and to provide the plurality of binary input signals to the K-LUT, wherein the input multiplexer is configured to receive input signals from at least one of the network of input lines and provide output signals to the K-LUT, the input line network being configured to provide at least a first one of the plurality of binary input signals to both a first K-LUT portion and a second K-LUT portion in a first state, and provide a first carry-in signal to the first K-LUT portion and a second carry-in signal, which differs from the first carry-in signal, to the second K-LUT portion in a second state; and
an output line network including a network of output lines and an output multiplexer, the network of output lines arranged to receive, from the K-LUT, output signals that represent the binary result signals and to provide the network of output signals to the PLD routing architecture, wherein the output multiplexer selects an output signal at outputs of the K-LUT.

13. The PLD of claim 12, wherein:
the K-LUT includes a plurality of portions, each portion connected to the routing architecture via the input line network to receive at least some of the representative input signals; and
each portion of the plurality of portions of the K-LUT includes circuitry to generate the binary result signals indicative of at least two stages of the plurality of stages of the arithmetic combination of the plurality of binary input signals.

14. The PLD of claim 13 wherein:
the plurality of binary input signals are provided to each portion of the plurality of portions of the K-LUT.

15. The PLD of claim 13, wherein:
the input line network includes selector circuitry operable such that,
in the first state, wherein each collection of inputs to the K-LUT that includes an input to each portion of the plurality of portions of the K-LUT receives a same particular binary input signal, and
in the second state, at least one collection of inputs to the K-LUT does not receive the particular binary input signal.

16. The PLD of claim 15, wherein:
the selector circuitry of the input line network includes a plurality of input multiplexers, wherein outputs of said plurality of input multiplexers are connected to the collection of inputs to the K-LUT, and
the plurality of input multiplexers is operable such that, in the first state, each input multiplexer of the plurality of input multiplexers provides the particular binary input signal to the output of that multiplexer and, in the second state, each of at least some of the plurality of input multiplexers provides other than the particular binary input signal to the output of such input multiplexer.

17. The PLD of claim 16, wherein:
the input line network includes at least a first input multiplexer between the routing architecture and the first K-LUT portion and at least a second input multiplexer between the routing architecture and the second K-LUT portion;
the input line network is operable to
in the first state, provide at least the first one of the input signals to both the first K-LUT portion and the second K-LUT portion, via the first input multiplexer and the second input multiplexer, respectively, and
in the second state, instead provide the first carry-in signal to the first K-LUT portion and the second carry-in signal to the second K-LUT portion, via the first input multiplexer and the second input multiplexer, respectively.

18. The PLD of claim 17, wherein:
the K-LUT portions include at least a first K-LUT portion and a second K-LUT portion;
the output line network includes at least a first output multiplexer, controlled by a second one of the plurality of binary input signals, and at least a second output multiplexer, controlled by the second binary input signal,
the first K-LUT portion is comprised of a first sub-portion and a second sub-portion;
the second K-LUT portion is comprised of a third sub-portion and a fourth sub-portion;
the first output multiplexer selects between the output of the first sub-portion and the second sub-portion; and
the second output multiplexer selects between the output of the third sub-portion and the fourth sub-portion.

19. The PLD of claim 18, wherein:

each of the first K-LUT portion and the second K-LUT portion is a K-1 LUT.

20. The PLD of claim 19, wherein:

each of the first sub-portion, the second sub-portion, the third sub-portion and the fourth sub-portion is a K-2 LUT.

* * * * *